US009083578B1

(12) United States Patent
Agrawal

(10) Patent No.: US 9,083,578 B1
(45) Date of Patent: Jul. 14, 2015

(54) NUMERICALLY CONTROLLED OSCILLATOR WITH FRACTIONAL FREQUENCY CONTROL WORD INPUTS

(71) Applicant: Maxim Integrated Products, Inc., San Jose, CA (US)

(72) Inventor: Jagdish Kumar Agrawal, Bangalore (IN)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 50 days.

(21) Appl. No.: 13/943,047

(22) Filed: Jul. 16, 2013

Related U.S. Application Data

(60) Provisional application No. 61/843,548, filed on Jul. 8, 2013.

(51) Int. Cl.
*H03L 7/095* (2006.01)
*H04L 27/04* (2006.01)
*H03L 7/00* (2006.01)
*G06F 1/03* (2006.01)

(52) U.S. Cl.
CPC .... *H04L 27/04* (2013.01); *H03L 7/00* (2013.01); *G06F 1/0328* (2013.01); *H03L 7/095* (2013.01)

(58) Field of Classification Search
CPC ........ G06F 1/0328; H03B 21/02; H03L 7/095
USPC .................. 331/1 A; 327/105, 106, 129, 107; 375/316; 708/276, 271
See application file for complete search history.

(56) References Cited

U.S. PATENT DOCUMENTS 7,064,616 B2 * 6/2006 Reichert ....................... 331/1 A

* cited by examiner

*Primary Examiner* — Arnold Kinkead

(57) ABSTRACT

A numerically controlled oscillator (NCO) module includes a first accumulator circuit, a second accumulator circuit, and a phase-to-amplitude converter module. The first accumulator circuit receives a clock signal and at least first portions of each of multiple frequency control words and accumulates the first portions to generate a phase value. Each of the frequency control words identifies a fractional value and includes a respective one of the first portions and a respective second portion. The second accumulator circuit accumulates the second portions and generates a trigger signal based on a result of the accumulated second portions. The first accumulator circuit is configured to adjust the phase value based on the trigger signal. The phase-to-amplitude converter module generates a digital signal based on the clock signal and the phase value. An output transmits an output signal from the NCO module based on the digital signal.

23 Claims, 3 Drawing Sheets

NUMERICALLY CONTROLLED OSCILLATOR WITH FRACTIONAL FREQUENCY CONTROL WORD INPUTS

CROSS-REFERENCE TO RELATED APPLICATIONS

This application claims the benefit of U.S. Provisional Application No. 61/843,548, filed on Jul. 8, 2013. The entire disclosure of the application referenced above is incorporated herein by reference.

FIELD

The present disclosure relates to numerically controlled oscillators.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Numerically controlled oscillators (NCOs) are used in digital communication systems instead of phase lock loops to generate high bandwidth carrier signals. A NCO is a digital signal generator that generates a synchronous discrete-time representation of an oscillating signal. A NCO typically includes a phase accumulator and a phase-to-amplitude converter. The phase accumulator accumulates frequency control word (FCWs) received from a register to generate an accumulated phase word. The FCWs indicate digital phase increments by which the accumulated phase word out of the phase accumulator is to be increased for each clock cycle of a clock signal.

At each pulse of the clock signal, a received FCW is added to a previous output of the phase accumulator. The FCW is an integer value that is used as a phase angle step. The FCW is added to a previously accumulated phase value at each $1/f_{clk}$ seconds to produce a linearly increasing digital value, where $f_{clk}$ is the frequency of the clock signal. The FCWs and the accumulated phase word may each have, for example, M-bits. An output frequency resolution $f_{res}$ of a NCO can be defined by equation 1.

$$f_{res} = \frac{f_{clk}}{2^M} \quad (1)$$

The output frequency resolution $f_{res}$ of the NCO is fixed, for a reference clock frequency $f_{clk}$ and a number of bits M of the summed output of the phase accumulator (referred to as the width of the phase accumulator).

SUMMARY

A numerically controlled oscillator module is provided and includes a first accumulator circuit, a second accumulator circuit, and a phase-to-amplitude converter module. The first accumulator circuit is configured to receive a clock signal and at least first portions of each of multiple frequency control words and accumulate the first portions to generate a phase value. Each of the frequency control words identifies a fractional value and includes a respective one of the first portions and a respective second portion. The second accumulator circuit is configured to accumulate the second portions and generate a trigger signal based on a result of the accumulated second portions. The first accumulator circuit is configured to adjust the phase value based on the trigger signal. The phase-to-amplitude converter module is configured to generate a digital signal based on the clock signal and the phase value. An output is configured to transmit an output signal from the numerically controlled oscillator module based on the digital signal.

In other features, a method is provided and includes receiving at a numerically controlled oscillator module a clock signal and at least first portions of each of multiple frequency control words. The first portions are accumulated to generate a phase value. Each of the frequency control words identifies a fractional value and includes a respective one of the first portions and a respective second portion. The second portions are accumulated. A trigger signal is generated based on a result of the accumulated second portions. The phase value is adjusted based on the trigger signal. A digital signal is generated based on the clock signal and the phase value. An output signal is transmitted from the numerically controlled oscillator module based on the digital signal.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

Certain NCO applications require an output frequency of a NCO to be in a 1 Hertz (Hz) increment, such that the output frequency can be plotted directly on a grid line, where the frequency of the grid line is an integer and is divisible by 1. A frequency is divisible by 1 if the result of dividing the frequency by 1 is an integer greater than or equal to 1. Frequency resolution of traditional NCOs is equal to a clock frequency divided by an integer number, as shown by above equation 1. This integer number is typically a power of two (e.g., $2^m$, where m is a width of a phase accumulator). The frequency resolution can be a fraction of a reference clock frequency of the NCOs. Thus, the output frequencies of the NCOs have fractional values, which cannot be plotted on grid lines having corresponding frequencies that are each divisible by 1.

The implementations disclosed herein provide NCO modules that provide integer valued output frequencies, which are divisible by 1. The output frequencies are divisible by 1 regardless of a reference clock frequency of the NCO modules. The implementations provide improved frequency resolution over traditional NCOs. The improved frequency resolution may be equal to 1 Hz and/or a multiple thereof. The improved frequency resolution is provided while allowing frequency control words (FCWs) of the NCO modules to be fractional and/or rational numbers. The implementations include changing the denominator factor of the above equation 1 dynamically such that the frequency resolution becomes constant for a given reference clock frequency $f_{clk}$.

Figure 1:
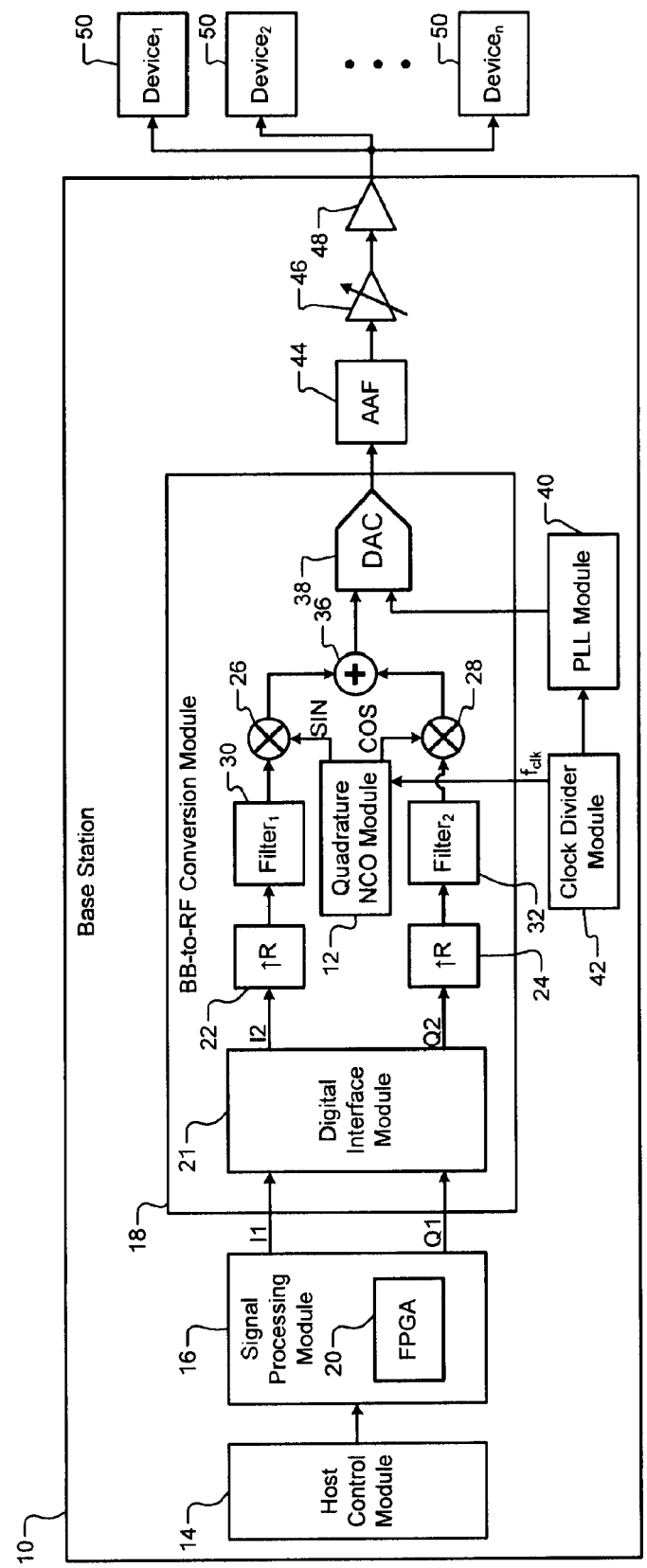
FIG. 1 is a functional block and schematic diagram of a base station incorporating a NCO module in accordance with the present disclosure.

FIG. 1 shows a base station 10 incorporating a quadrature NCO module 12. The base station 10 may include, for example, a host control module 14, a signal processing module 16, and a baseband-to-radio frequency (BB-to-RF) conversion module 18. Although a certain number of signal lines are shown in FIG. 1 between modules and/or devices, any number of signal lines may be included between the modules and/or devices. The host control module 14 may control the signal processing module 16 to generate BB signals for transmission from the base station 10.

The signal processing module 16 may include, for example, a field programmable gate array (FPGA) 20, which may generate BB signals. The BB signals may include in-phase signals I1 and quadrature phase signals Q1. The signals I1, Q1 may be serial signals that are received by the BB-to-RF conversion module 18. The BB-to-RF conversion module 18 interpolates the signals I1, Q1 in frequency and includes a digital interface module 21, upsamplers 22, 24, mixers 26, 28, filters 30, 32, the quadrature NCO module 34, a summer 36 and a digital-to-analog converter (DAC) 38.

The digital interface module 21 receives the BB signals from the signal processing module 16. The digital interface module 21 may be, for example, a serial-to-parallel interface and satisfy Joint Electron Devices Engineering Council (JEDEC) standards. The digital interface module 21 may receive bits serially from the signal processing module 16 and may convert the bits into parallel bit streams I2, Q2 for output to the upsamplers 22, 24. The upsamplers 22, 24 upsample the signals I2, Q2 output from the digital interface module 21 by a factor of R, where R may be an integer.

Outputs of the upsamplers 22, 24 are provided respectively to the filters 30, 32. The filters 30, 32 may include, for example, finite impulse response (FIR) filters and/or low pass filters. Outputs of the filters 30, 32 are provided to the mixers 26, 28. Each of the mixers 26, 28 may multiply a respective output of one of the filters 30, 32 and a respective carrier frequency signal received from the quadrature NCO module 12. The quadrature NCO module 12 generates carrier frequency signals SIN, COS, as is further described below. The combination of the mixers 26, 28 and the quadrature NCO module 12 provides quadrature amplitude modulation (QAM). The summer 36 sums outputs of the mixers 26, 28.

The resultant sum generated by the summer 36 is provided to the DAC 38. The DAC 38 converts the output of the summer 36 to an analog signal based on a first clock signal received from a phase lock loop (PLL) module 40. The PLL module 40 may receive a second clock signal from a clock divider module 42 and generate the first clock signal based on the second clock signal. The clock divider module 42 may provide the second clock signal to the PLL module 40 and to the quadrature NCO module 12. The second clock signal may be referred to as a reference clock signal and have a reference clock frequency $f_{clk}$.

Output of the DAC 38 may be filtered using an anti-aliasing filter 44, which may be a bandpass filter. Output of the anti-aliasing filter 44 is provided to a variable amplifier 46 followed by a buffer 48. Output of the buffer 48 may be transmitted via cable and/or wirelessly to one or more network devices 50. The network devices 50 may be, for example, computers, cellular phones, mobile devices, etc.

Figure 2:
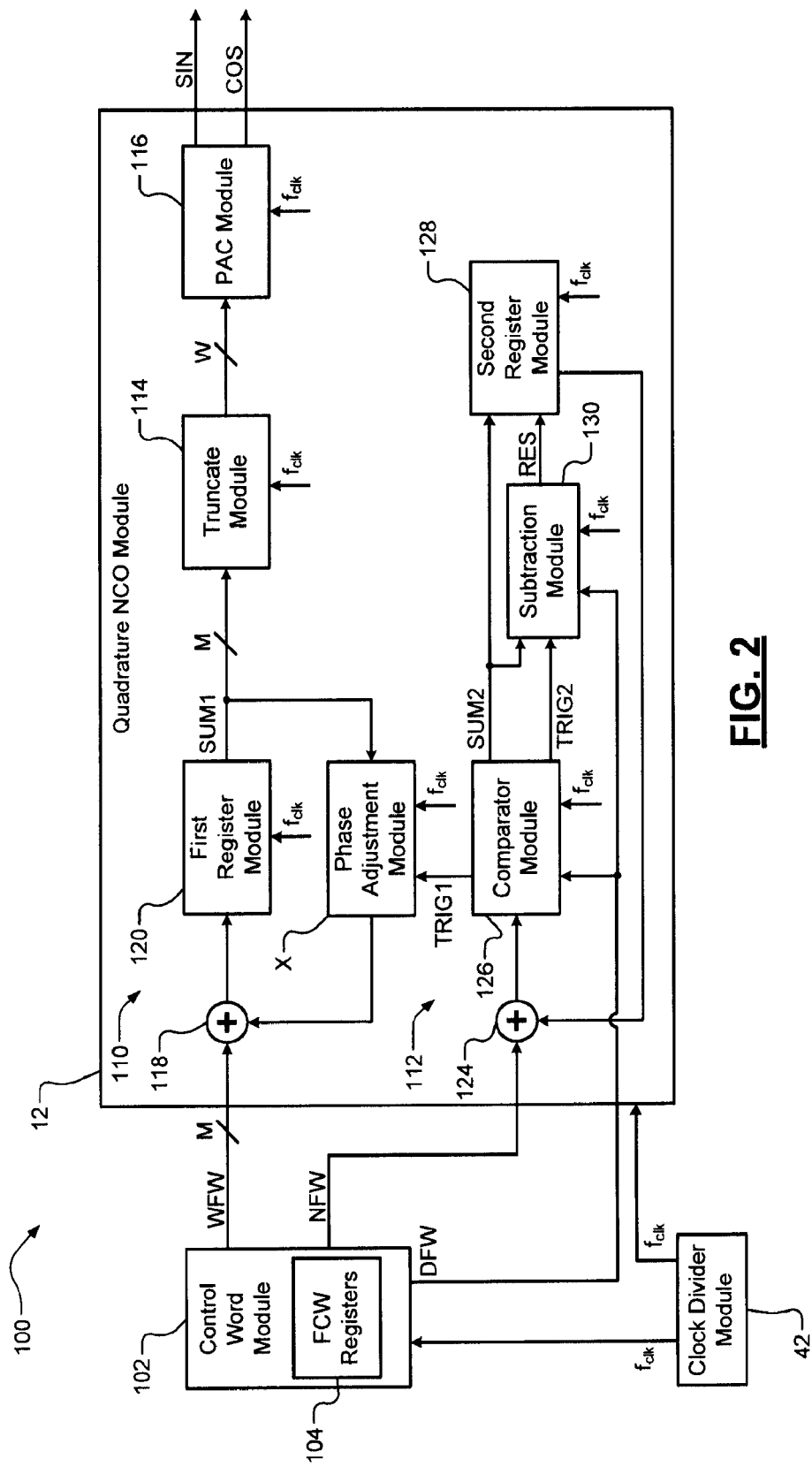
FIG. 2 is a functional block and schematic diagram of a NCO circuit in accordance with the present disclosure.

FIG. 2 shows a NCO circuit 100. The NCO circuit 100 may be included in a base station (e.g., the base station 10 of FIG. 1) and includes the clock divider module 42, a control word module 102, and the quadrature NCO module 12. The clock divider module 42 outputs the reference clock signal having the reference clock frequency $f_{clk}$ to the control word module 102 and the quadrature NCO module 12.

The control word module 102 may include FCW registers 104 that store FCWs. The FCWs may be fractional values and may be referred to as phase increments for respective clock cycles of the quadrature NCO module 12. Each cycle of the quadrature NCO module 12 is performed based on the reference clock frequency $f_{clk}$. Each of the FCWs may be stored as multiple integer values including a whole number fractional control word (WFW), a numerator fractional control word (NFW), and a denominator fractional control word (DFW). A WFW is a whole number portion of a FCW, where the FCW may be a fraction reduced to its lowest terms. A NFW is a numerator of a fractional portion of a FCW. A DFW is a denominator of a fractional portion of a FCW. For example, a FCW may be equal to 6.3125, where the corresponding WFW is 6, the NFW is 5 and the DFW is 16, where NFW/DFW=5/16=0.3125. A FCW is provided to the quadrature NCO module 12 in the form of three signals based on the reference clock frequency $f_{clk}$. The three signals are identified in FIG. 2 as WFW, NFW and DFW. The three signals WFW, NFW, DFW include the respective WFWs, NFWs, DFWs for corresponding FCWs.

The quadrature NCO module 12 receives the reference clock signal and each of the modules of the quadrature NCO module 12 operates based on the reference clock frequency $f_{clk}$. The quadrature NCO module 12 includes a first accumulator circuit (phase or WFW accumulator) 110 and a second accumulator circuit (NFW accumulator) 112, a truncate module 114 and a phase-to-amplitude converter (PAC) module 116. The first accumulator circuit 110 sums WFWs to provide a first resultant sum in the form of a first summation signal SUM1. If unchanged, the WFWs may have the same value. Bits of the WFWs may be received in parallel, where each of the WFWs may include M bits, where M is an integer. The second accumulator circuit 112 sums NFWs based on the DFWs and provides a second resultant sum in the form of a second summation signal SUM2. If unchanged, the NFWs may have the same value.

The first resultant sum is provided to a truncate module 114, which may truncate the number of bits (or signals) M out of the first accumulator circuit 110. Bits of the first resultant sum may be received by the truncate module 114 in parallel, where each resultant sum includes M bits. The number of bits (or signals) out of the truncate module 114 is W, where W is an integer. The truncation performed by the truncate module 114 reduces ratios of (i) signal-to-noise ratios (SNRs) to (ii) spurious free dynamic range (SFDR) values. Without this compression by the truncate module 114 it may be infeasible to implement the PAC module 116 due to high area requirements associated with SIN, COS mapping performed by the PAC module 116. Each bit drop (or associated compression) results in area requirements reduced by half.

The PAC module 116 may include mapping and capture flip-flops and converts the output of the truncate module 114 to the carrier signals SIN, COS. The PAC module 116 receives the W bits for each truncation in parallel. The output frequency $f_{out}$ of the quadrature NCO module 12 or frequencies of the carrier signals SIN, COS can be calculated using the following equation 2, where ΔP is a phase increment word or FCW, and where the output frequency $f_{out}$ and the frequencies of the carrier signals SIN, COS are the same.

$$f_{out} = \frac{\Delta P \cdot f_{clk}}{2^m} \quad (2)$$

The first accumulator circuit 110 includes a first summer 118, a first register module 120 and a phase adjustment module 122. For each clock cycle, the first summer 118 sums a received WFW with a first accumulated sum SUM1 (referred to as an accumulated phase word or accumulated phase value). The first accumulated sum SUM1 may be received from the first register module 120. The output of the first summer 118 is referred to as an angle value. The FCWs and the accumulated phase words may each have, for example, M-bits.

An accumulated phase word may be generated using a modulo $2^M$ overflowing property of a M-bit phase accumulator, such that a most significant bit (MSB) is dropped when 2 M-bit values are added to provide a value having M+1 bits. For example, when the values 2 (or 10 in binary) and 3 (or 11 in binary) are added to provide 5 (or 101 in binary), the MSB of 1 is dropped to provide a value of 1 (or 01 in binary). The summed result, based on the modulo $2^M$ overflowing property, is a M-bit (or in the above example, a 2-bit) value. The rate of the overflow may be equal to an output frequency of the quadrature NCO module 12.

The first register module 120 stores the angle values received from the first summer 118. The phase adjustment module 122 adjusts phase of the first summation signal SUM1 or the phase value based on a first trigger signal TRIG1 received from the second accumulation circuit 112. The phase adjustment module 122 may, for example, increment the first summation signal SUM1 when the first trigger signal TRIG1 is HIGH. The phase adjustment module 122, may, for example, not increment the first summation signal SUM1 when the first trigger signal TRIG1 is LOW.

The second accumulator circuit 112 includes a second summer 124, a comparator module 126, a second register module 128 and a subtraction module 130. For each clock cycle, the second summer 124 sums a received NFW with a second accumulated sum SUM2. The second accumulated sum SUM2 may be received from the second register module 128. The second register module 128 stores accumulated NFW values. NFWs are accumulated separately from the accumulation of WFWs to find a correction in the angle value to correct a phase word value for a FCW having a fractional value. NFWs are accumulated and when the second summation signal SUM2 becomes greater than a DFW, the first summation signal for the first accumulator circuit 110 is incremented by 1 and the DFW is subtracted from the second summation signal SUM2 for a next or subsequent clock cycle. This results in dynamically changing phase of the first accumulator circuit 110, resulting in the quadrature NCO module 12 having a fixed resolution output.

The comparator module 126 compares the output of the second summer 124 to a DFW received from the control word module 102. If the output of the second summer 124 is greater than the DFW, the comparator module 126 may set a comparison signal (or second trigger signal TRIG2) HIGH. If the output of the second summer is less than or equal to the DFW, the comparator module 126 may set the comparison signal LOW.

If the second trigger signal TRIG2 is HIGH, the subtraction module 130 subtracts the value of the DFW from the second summation signal SUM2. The subtraction module 130 may receive the second summation signal SUM2 from the second summer 124 or the comparator module 126. The subtraction module 130 generates a resultant signal RES based on the subtraction. The resultant signal RES may be equal to the result of subtracting the value of the DFW from the second summation signal SUM2. The subtraction module 130 forwards the resultant signal RES to the second register module 128 on a next clock cycle. The second register module 128 then forwards the resultant signal RES to the second summer 124 on a following clock cycle for a next summation.

If the second trigger signal TRIG2 is LOW, the comparator module 126 forwards the second summation signal SUM2 to the second register module 128. The second register module 128 then forwards the resultant signal RES to the second summer 124 on a respective clock cycle for a following summation.

Operation of the NCO circuit 100 and quadrature NCO module 12 allow a FCW to be a rational number, which allows a NCO output frequency be placed on a grid line of a grid, where the grid lines are in 1 Hz increments and are each associated with a frequency that is divisible by 1. The NCO output frequency is provided regardless of the reference clock frequency $f_{clk}$. In using a fractional FCW, the quadrature NCO module 12 dynamically adjusts the accumulated phase word to effectively achieve a predetermined frequency resolution independent of the reference clock frequency $f_{clk}$. The quadrature NCO module 12 may have a fixed 1 Hz resolution for a range of reference clock frequencies.

The quadrature NCO module 12 dynamically changes the denominator factor of the above equation 1 such that the frequency resolution becomes constant for a given reference clock frequency $f_{clk}$. Although traditional NCOs provide a fixed resolution, the traditional NCOs accumulate FCWs once per clock cycle without phase adjustment. In contrast, the phase adjustment module 122 adjusts the phase or first accumulated sum of the first summation signal SUM1 periodically, at predetermined intervals, time-to-time, and/or when, for example, the second accumulated sum of the second summation signal SUM2 is greater than a DFW. As an example the first accumulated sum may be incremented by 1 when the second accumulated sum is greater than a DFW. This provides a fixed output frequency resolution of the carrier signals of 1 Hz.

As an example, unlike a traditional NCO, the quadrature NCO module 12 is capable of having the number of bits M in the first accumulated sum be 10, the reference clock frequency $f_{clk}$ be set at 1000 Hz, an input FCW received by the NCO be 1, and provide an output frequency resolution of 1 Hz. With a number of bits M being 10, a reference clock frequency $f_{clk}$ being set at 1000 Hz, and an input FCW being 1, the output frequency resolution of a traditional NCO (calculated using equation 1) is 1000/1024 or 0.976 Hz. The implementations disclosed herein allow WFW, NFW and DFW integer values of a FCW to be programmed and provided to a NCO module. Continuing based on the same example, a WFW may be set to 1, a NFW may be set to 3, and a DFW may be set to 125. This allows the first accumulator circuit 110 to take 1000 clock cycles to complete a full clock period instead of taking 1024 clock cycles to complete a full clock period. This is because the phase or first accumulated value is incremented an average of 41.67 times over the 1000 clock cycles of the reference clock signal.

Figure 3:
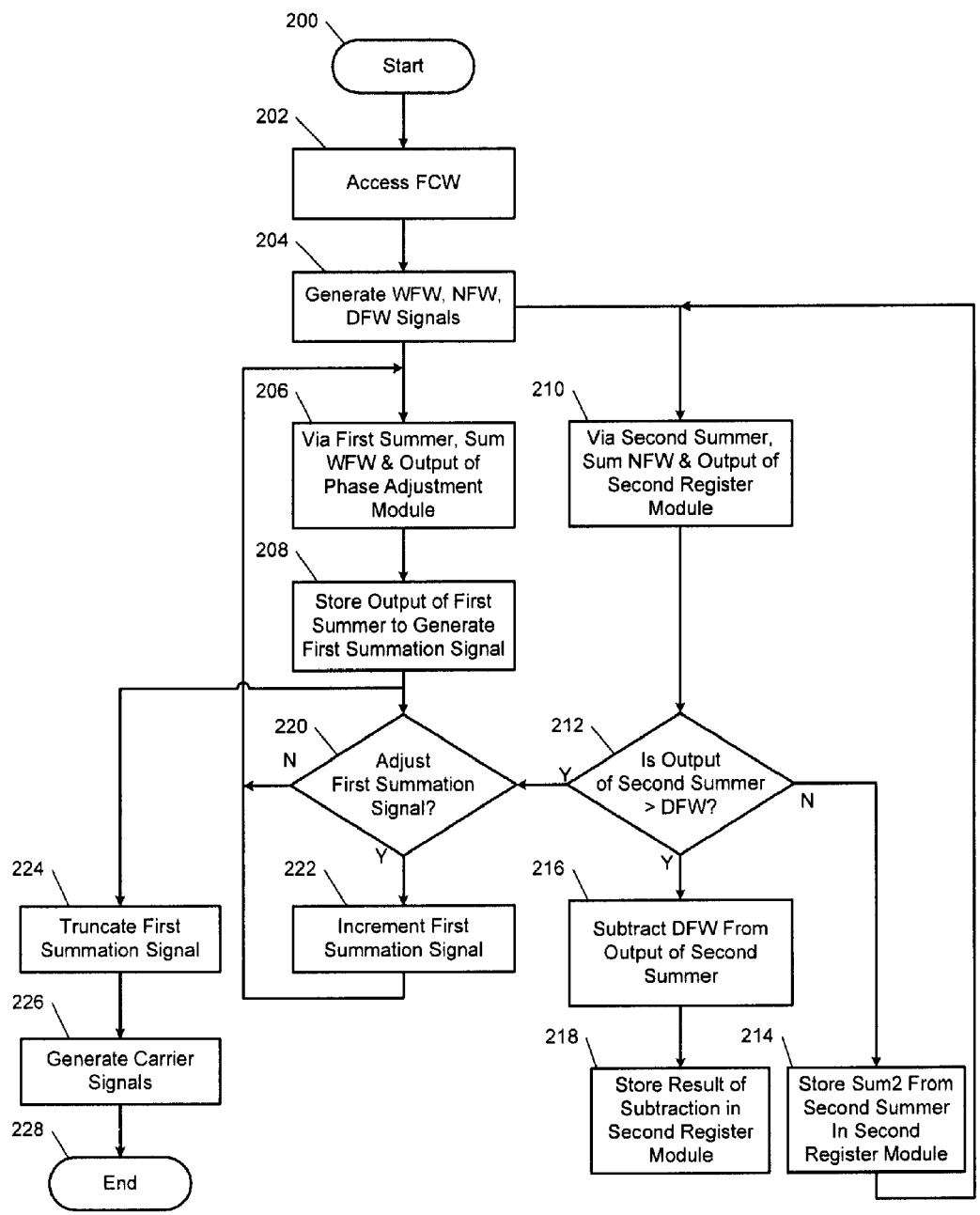
FIG. 3 illustrates a method of operating a NCO in accordance with an embodiment of the present disclosure.

FIG. 3 illustrates a method of operating a quadrature NCO module (e.g., the quadrature NCO module 12 of FIGS. 1-2). Although the following tasks are primarily described with respect to the implementations of FIGS. 1-2, the tasks may be easily modified to apply to other implementations of the present disclosure. The tasks are iteratively performed.

The method may begin at 200. At 202, a control word module (e.g., the control word module 102) accesses a FCW. At 204, the control word module, for a clock cycle, generates WFW, NFW and DFW signals based on the FCW and the reference clock signal. Values of the FCW and corresponding WFW, NFW and DFW may be predetermined and/or fixed for a predetermined output carrier frequency $f_{out}$ of the quadrature NCO module. The values of FCW, WFW, NFW and DFW may not change until a new output and/or carrier frequency $f_{out}$ is to be generated.

A FCW may be an integer value, which is calculated as $f_{out}$ divided $f_{res}$, to generate an output frequency carrier from a NCO. The FCW may be a fractional value which is then converted into 3 integer values, where the first integer value is a whole number portion of the FCW and the second and third integer values are respectively a numerator (e.g., NFW) and a denominator (e.g., DFW) of a rational number portion of the FCW, and where FCW=WFW+NFW/DFW. The phase increment values may be changed dynamically based on the values of DFW and NFW, such that, for instance, the output carrier frequency $f_{out}$ can become a multiple of 1 Hz.

At 206, a first summer (e.g., the first summer 118) sums the WFW signal and an output of a phase adjustment module (e.g., the phase adjustment module 122) for a clock cycle based on the reference clock signal. At 208, a first register module (e.g., the first register module 120) stores an output of the first summer to generate the first summation signal SUM1.

At 210, a second summer (e.g., the second summer 124) sums the NFW signal and an output of a second register module (e.g., the second register module 128) for a clock cycle based on the reference clock signal. The clock cycle of task 210 may be the same clock cycle as task 206.

At 212, a comparator module (e.g., the comparator module 126), for a clock cycle based on the reference clock signal, (i) compares the output (second summation signal SUM2) of the second summer to the DFW signal, and/or (ii) determines whether NFW/DFW>1. The comparator module generates the first trigger signal TRIG1 and the second trigger signal TRIG2 based on the comparison and/or determination. If the second summation signal SUM2 is not greater than the DFW signal and/or NFW/DFW≤1, task 214 is performed, otherwise tasks 216 and 220 are performed.

At 214, the resultant sum of the second summer or the value of the second summation signal SUM2 is stored in the second register module for a clock cycle based on the reference clock signal.

At 216, a subtraction module (e.g., the subtraction module 130) subtracts the value of the DFW signal from the second summation signal for a clock cycle based on the reference clock signal. The subtraction is performed based on the second trigger signal TRIG2, as described above. At 218, the subtraction module stores the result of the subtraction performed at 216 in the second register module for a clock cycle based on the reference clock signal.

At 220, the phase adjustment module determines whether to adjust the first summation signal SUM1 based on the first trigger signal TRIG1 and based on the reference clock signal for a clock cycle. Task 222 is performed when the first summation signal SUM1 is adjusted. Task 206 is performed when the first summation signal SUM1 is not adjusted.

At 222, the phase adjustment module may increase and/or increment the first summation signal SUM1 for a clock cycle based on the reference clock signal. Task 206 may be performed subsequent to task 222. Task 222 may be performed for a same clock cycle as task 208.

At 224, a truncate module (e.g., the truncate module 114) truncates the first summation signal, as described above. At 226, a PAC module (e.g., the PAC module 116) phase-to-amplitude converts the first summation signal SUM1 to carrier signals SIN, COS for a clock cycle based on the reference clock signal. Subsequent to task 226, task 202 may be performed or the method may end at 228, as shown.

The above-described tasks are meant to be illustrative examples; the tasks may be performed sequentially, synchronously, simultaneously, continuously, during overlapping time periods or in a different order depending upon the application. Also, any of the tasks may not be performed or skipped depending on the implementation and/or sequence of events.

The phase accumulator of traditional NCO accumulate phase values in a fixed step based on an input FCW. By receiving a fractional frequency control word and dynamically adjusting an accumulated phase value, the NCO modules disclosed herein effectively achieve a predetermined frequency resolution independent of a reference clock frequency.

The wireless communications described in the present disclosure can be conducted in full or partial compliance with IEEE standard 802.11-2012, IEEE standard 802.16-2009, IEEE standard 802.20-2008, and/or Bluetooth Core Specification v4.0. In various implementations, Bluetooth Core Specification v4.0 may be modified by one or more of Bluetooth Core Specification Addendums 2, 3, or 4. In various implementations, IEEE 802.11-2012 may be supplemented by draft IEEE standard 802.11ac, draft IEEE standard 802.11ad, and/or draft IEEE standard 802.11ah.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:

1. A numerically controlled oscillator module comprising:
   a first accumulator circuit configured to receive a clock signal and at least first portions of each of a plurality of frequency control words and accumulate the first portions to generate a phase value, wherein each of the plurality of frequency control words identifies a fractional value and includes a respective one of the first portions and a respective second portion;
   a second accumulator circuit configured to accumulate the second portions and generate a trigger signal based on a result of the accumulated second portions, wherein the second portions are numerators of the fractional values of the plurality of frequency control words, and
   wherein the first accumulator circuit is configured to adjust the phase value based on the trigger signal;
   a phase-to-amplitude converter module configured to generate a digital signal based on the clock signal and the phase value; and
   an output configured to transmit an output signal from the numerically controlled oscillator module based on the digital signal.

2. The numerically controlled oscillator module of claim 1, wherein:
   each of the first portions identifies a respective whole number of one of the plurality of frequency control words; and
   the first accumulator circuit comprises
      a summer configured to sum the whole numbers to generate the phase value,
      a register module configured to store the phase value, and
      a phase adjustment module configured to adjust the phase value based on the trigger signal.

3. The numerically controlled oscillator module of claim 1, wherein each of the first portions identifies a whole number of one of the plurality of frequency control words.

4. The numerically controlled oscillator module of claim 1, wherein:
   each of the plurality of frequency control words includes a whole number and the corresponding fractional value;
   each of the fractional values include a corresponding one of the numerators and a corresponding denominator; and
   each of the first portions identifies a respective one of the whole numbers of one of the plurality of frequency control words.

5. The numerically controlled oscillator module of claim 4, wherein the second accumulator circuit is configured to accumulate the second portions based on the denominators.

6. The numerically controlled oscillator module of claim 4, wherein the second accumulator circuit comprises:
   a summer configured to sum the numerators; and
   a comparator module configured to compare an output of the summer to one of the denominators and generate the trigger signal based on the result of the comparison.

7. The numerically controlled oscillator module of claim 6, wherein:
   the second accumulator circuit comprises a register module; and
   the register module is configured to, based on the comparison,
      receive (i) the output of the summer, or (ii) a result of the output of the summer minus the one of the denominators, and
      forward to the summer (i) the output of the summer, or (ii) a result of the output of the summer minus the one of the denominators.

8. The numerically controlled oscillator module of claim 1, wherein:
   each of the plurality of frequency control words includes a whole number and a corresponding one of the fractional values;
   each of the fractional values includes a corresponding one of the numerators and a corresponding denominator;
   each of the first portions identifies a respective whole number of one of the plurality of frequency control words.
   the first accumulator circuit comprises
      a first summer configured to sum the whole numbers to generate the phase value, and
      a phase adjustment module configured to adjust the phase value based on the trigger signal; and
   the second accumulator circuit comprises
      a second summer configured to sum the numerators, and
      a comparator module configured to compare an output of the summer to one of the denominators and generate the trigger signal based on the result of the comparison.

9. The numerically controlled oscillator module of claim 8, wherein the phase adjustment module increments the phase value based on the trigger signal.

10. The numerically controlled oscillator module of claim 1, wherein each of the plurality of frequency control words has a same value.

11. A numerically controlled oscillator module comprising:
   a first accumulator circuit configured to receive a clock signal and at least first portions of each of a plurality of frequency control words and accumulate the first portions to generate a phase value, wherein each of the plurality of frequency control words identifies a fractional value and includes a respective one of the first portions and a respective second portion;
   a second accumulator circuit configured to accumulate the second portions and generate a trigger signal based on a result of the accumulated second portions,
   wherein the first accumulator circuit is configured to adjust the phase value based on the trigger signal;
   a phase-to-amplitude converter module configured to generate a digital signal based on the clock signal and the phase value;
   an output configured to transmit an output signal from the numerically controlled oscillator module based on the digital signal; and
   a truncate module configured to truncate the output of the first accumulator circuit,
   wherein the phase-to-amplitude converter module is configured to convert an output of the truncate module to the digital signal.

12. A method comprising:
receiving at a numerically controlled oscillator module a clock signal and at least first portions of each of a plurality of frequency control words;
accumulating the first portions to generate a phase value, wherein each of the plurality of frequency control words identifies a fractional value and includes a respective one of the first portions and a respective second portion;
accumulating the second portions, wherein the second portions are numerators of the fractional values of the plurality of frequency control words;
generating a trigger signal based on a result of the accumulated second portions;
adjusting the phase value based on the trigger signal;
generating a digital signal based on the clock signal and the phase value; and
transmitting an output signal from the numerically controlled oscillator module based on the digital signal.

13. The method of claim 12, further comprising:
summing whole numbers of the plurality of frequency control words to generate the phase value, wherein each of the first portions identifies a respective one of the whole numbers;
storing the phase value; and
adjusting the phase value based on the trigger signal.

14. The method of claim 12, wherein each of the first portions identifies a whole number of one of the plurality of frequency control words.

15. The method of claim 12, wherein:
each of the plurality of frequency control words includes a whole number and the corresponding fractional value;
each of the fractional values includes a corresponding one of the numerators and a corresponding denominator; and
each of the first portions identifies a respective one of the whole numbers of one of the plurality of frequency control words.

16. The method of claim 15, further comprising accumulating the second portions based on the denominators.

17. The method of claim 15, further comprising:
summing the numerators via a summer;
comparing an output of the summer to one of the denominators; and
generating the trigger signal based on a result of the comparison.

18. The method of claim 17, further comprising, based on the comparison:
receiving (i) the output of the summer, or (ii) a result of the output of the summer minus the one of the denominators; and
forwarding to the summer (i) the output of the summer, or (ii) a result of the output of the summer minus the one of the denominators.

19. The method of claim 15, further comprising:
summing the whole numbers of the plurality of frequency control words to generate the phase value, wherein each of the plurality of frequency control words includes one of the whole numbers and a corresponding one of the fractional values;
each of the fractional values includes a corresponding one of the numerators and a corresponding denominator;
incrementing the phase value based on the trigger signal;
summing the numerators via a summer;
comparing an output of the summer to one of the denominators; and
generating the trigger signal based on the result of the comparison.

20. The method of claim 12, wherein each of the plurality of frequency control words has a same value.

21. The numerically controlled oscillator of claim 1, wherein the second accumulator circuit is configured to:
compare the result of the accumulated second portion to a denominator of one of the fractional values of the plurality of frequency control words;
if the result of the accumulated second portion is greater than the denominator, subtract the denominator from the result of the accumulated second portion; and
subsequent to subtracting the denominator from the result of the accumulated second portion, generate the trigger signal.

22. The numerically controlled oscillator of claim 1, wherein a frequency of the output signal is divisible by one.

23. The numerically controlled oscillator of claim 1, further comprising a control module configured to:
separate the first portions of the plurality of frequency control words from the fractional values of the plurality of frequency control words;
provide the first portions to the first accumulator circuit; and
provide, as separate inputs, (i) the numerators, and (ii) denominators of the plurality of frequency control words.

* * * * *

UNITED STATES PATENT AND TRADEMARK OFFICE
CERTIFICATE OF CORRECTION

| | | |
|---|---|---|
| PATENT NO. | : 9,083,578 B1 | |
| APPLICATION NO. | : 13/943047 | |
| DATED | : July 14, 2015 | |
| INVENTOR(S) | : Agrawal | |

It is certified that error appears in the above-identified patent and that said Letters Patent is hereby corrected as shown below:

In the Specification:
Column 3, Line 18         Delete "11" and insert --I1--
Column 3, Line 23         Delete "34," and insert --12,--

In the Claims:
Column 10, Line 25, Claim 8         Delete "words." and insert --words;--

Signed and Sealed this
First Day of December, 2015

Michelle K. Lee
*Director of the United States Patent and Trademark Office*